US006634313B2

(12) United States Patent
Hanawa et al.

(10) Patent No.: US 6,634,313 B2
(45) Date of Patent: Oct. 21, 2003

(54) HIGH-FREQUENCY ELECTROSTATICALLY SHIELDED TOROIDAL PLASMA AND RADICAL SOURCE

(75) Inventors: Hiroji Hanawa, Sunnyvale, CA (US); Kenneth S. Collins, San Jose, CA (US); John R. Trow, San Jose, CA (US); David Stover, Meridian, ID (US); Fernando Silveira, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 131 days.

(21) Appl. No.: 09/782,795

(22) Filed: Feb. 13, 2001

(65) Prior Publication Data

US 2002/0108713 A1 Aug. 15, 2002

(51) Int. Cl.[7] ............... C23C 16/00; H05H 1/00; H01L 21/00
(52) U.S. Cl. ............... 118/723 IR; 118/723 I; 156/345.35; 156/345.48; 315/111.51
(58) Field of Search ............... 118/723 I, 723 IR; 156/345.48, 345.49, 345.35; 315/111.51, 111.71

(56) References Cited

U.S. PATENT DOCUMENTS

| 2,344,138 A | 3/1944 | Drummond |
| 3,109,100 A | 10/1963 | Papp |
| 3,291,715 A | 12/1966 | Anderson |
| 4,086,506 A | 4/1978 | Kustom et al. ............... 310/74 |
| 4,277,306 A | 7/1981 | Ohkawa ............... 176/9 |
| 4,431,898 A | 2/1984 | Reinberg et al. ............... 219/121 |
| 4,585,986 A | 4/1986 | Dyer ............... 323/271 |
| 4,666,734 A | 5/1987 | Kamiya et al. ............... 427/39 |
| 4,713,208 A | 12/1987 | Furth et al. ............... 376/137 |

(List continued on next page.)

FOREIGN PATENT DOCUMENTS

| EP | 0 546 852 | 6/1993 | |
| EP | 0 836 218 | 4/1998 | |
| JP | 2-260399 | 10/1990 | ............ H05H/1/46 |
| JP | 5-144594 | 6/1993 | ............ H05H/1/46 |
| JP | 5-166595 | 7/1993 | ............ H05H/1/46 |
| WO | WO 90/10945 | 9/1990 | |
| WO | WO 99/00823 | 1/1999 | |
| WO | 01/11650 | 2/2001 | |

OTHER PUBLICATIONS

U.S. patent application Ser. No. 09/246,036, Chandran et al., filed Feb. 4, 1999.
Dean et al., "Status and Objectives of Tokamak Systems for Fusion Research," *USERDA Report WASH–1295*, (1974) (available from the Superintendent of Documents, U.S. Goverment Printing Office) pp. 1–106.
Furth, H.P., "Tokamak Research," *Nuclear Fusion*, (1975) 15:487–534.
Eckert, H.U., "Induction Plasmas at Low Frequencies," *AAA Journal*, (Aug. 1971) vol. 9, No. 8, pp. 1452–1456.
Hagler et al., "An Introduction to Controlled Thermonuclear Fusion," *Library of Congress Cataloging in Publication Data*, (1977) pp. 59–61 and 178.
Kandler et al., "Characterization of plasma in an inductively coupled high–dense plasma source," *Surface & Coatings Technology*, (1995) 74–75, pp. 539–545.

Primary Examiner—Parviz Hassanzadeh
(74) Attorney, Agent, or Firm—Roberts, Abokhair & Mardula; Joseph Bach

(57) ABSTRACT

An electrostatically shielded toroidal plasma and radical source is provided. The plasma source includes a grounded metallic plasma source chamber that defines an interior for plasma generation. The plasma source chamber is configured from two L-shaped portions arranged to form rectangularly shaped enclosure. Dielectric breaks are defined by gaps between the two L-shaped portions. A drive inductor is configured such that the metallic plasma source chamber is positioned between loops of the drive inductor.

19 Claims, 8 Drawing Sheets

U.S. PATENT DOCUMENTS

| | | |
|---|---|---|
| 4,778,561 A | 10/1988 | Ghanbari |
| 4,859,399 A | 8/1989 | Bussard ...................... 376/133 |
| 4,863,671 A | 9/1989 | Okada ........................ 376/143 |
| 4,867,859 A | 9/1989 | Harada et al. |
| 4,868,919 A | 9/1989 | Tanaka et al. ................. 355/27 |
| 5,014,321 A | 5/1991 | Klein ......................... 381/111 |
| 5,041,760 A | 8/1991 | Koloc .................... 315/111.41 |
| 5,061,838 A | 10/1991 | Lane et al. |
| 5,106,827 A | 4/1992 | Borden et al. |
| 5,174,875 A | 12/1992 | Hurwitt et al. ......... 204/192.12 |
| 5,290,382 A | 3/1994 | Zarowin et al. ............. 156/345 |
| 5,464,476 A | 11/1995 | Gibb et al. ........... 118/723 MP |
| 5,505,780 A | 4/1996 | Dalvie et al. ........ 118/723 MA |
| 5,514,246 A | 5/1996 | Blalock .................... 156/643.1 |
| 5,560,776 A | 10/1996 | Sugai et al. ........... 118/723 AN |
| 5,591,493 A | 1/1997 | Paranjpe et al. ............. 427/569 |
| 5,619,103 A | 4/1997 | Tobin et al. ............. 315/111.21 |
| 5,632,869 A | 5/1997 | Hurwitt et al. ......... 204/192.12 |
| 5,683,517 A | 11/1997 | Shan |
| 5,770,982 A | 6/1998 | Moore |
| 5,811,022 A | 9/1998 | Savas et al. ................... 216/68 |
| 5,897,752 A | 4/1999 | Hong et al. |
| 5,939,886 A | 8/1999 | Turner et al. ................ 324/464 |
| 5,948,168 A | 9/1999 | Shan et al. |
| 5,998,933 A | 12/1999 | Shun'ko ................ 315/111.51 |
| 6,041,735 A | 3/2000 | Murzin et al. |
| 6,150,628 A | 11/2000 | Smith et al. |
| 6,164,240 A | 12/2000 | Nikulin ................... 118/723 I |
| 6,203,657 B1 * | 3/2001 | Collison et al. ....... 156/345.48 |
| 6,348,126 B1 * | 2/2002 | Hanawa et al. ........ 156/345.48 |
| 6,418,874 B1 * | 7/2002 | Cox et al. ................ 118/723.1 |
| 6,432,260 B1 * | 8/2002 | Mahoney et al. ...... 156/345.35 |
| 6,453,842 B1 * | 9/2002 | Hanawa et al. ........... 118/723.1 |

\* cited by examiner

HIGH-FREQUENCY ELECTROSTATICALLY SHIELDED TOROIDAL PLASMA AND RADICAL SOURCE

BACKGROUND OF THE INVENTION

The present invention is related to substrate processing equipment and more particularly to plasma processing equipment for performing plasma processing steps such as deposition, cleaning, and/or etch processes on a process substrate.

It is well known that plasma discharges may be used to excite gases to produce activated gases containing ions, free radicals, atoms, and molecules. Such activated gases are used for numerous industrial applications, including, in particular, various operations performed during the fabrication of semiconductor devices. For example, plasma-processing methods are used in deposition processes, such as plasma-enhanced chemical vapor deposition (PECVD) or high-density-plasma chemical vapor deposition (HDP-CVD), to deposit layers of material on substrates. Plasma-processing methods are also used within a number of etching techniques, such as reactive ion etching (RIE) or deep RIE (DRIE). Plasmas are also used in cleaning processes to prepare a processing chamber or the surface of a particular substrate for subsequent processes; such processes include a plasma wafer surface clean or activation prior to formation of a layer on the surface.

Generally, plasma-processing applications can be characterized by the kinetic energy of the ions in the plasma and by the level of direct exposure the material being processed has to the plasma. For example, applications sensitive to material damage generally require low-kinetic-energy ions and/or shielding of the material from the plasma, while applications such as anisotropic etching require ions with high kinetic energy. Certain applications, such as RIE or DRIE require relatively precise control of the ion energy. Applications such as generating ion-activated chemical reactions, and etching or deposition of material into high-aspect-ratio structures, are examples of processes that make use of direct exposure of the material to a high-density plasma.

This wide application of plasma processing uses is reflected in the extensive variety of available plasma processing systems and apparatuses. The basic methods these systems use for plasma generation include dc discharge, RF discharge, and microwave discharge. One particular type of plasma processing chamber places the wafer on an electrode of the plasma circuit, opposite another planar electrode, and capacitively couples high-frequency electrical power to the two electrodes to form a plasma between them. Such a plasma reactor has advantages where it is desirable to form the plasma in the presence of the substrate, such as when the physical movement of plasma species to and from the substrate is specifically desired. However, some devices or materials are not readily compatible with this type of plasma formation, particularly because the plasma includes high-energy photons and their direct bombardment on the substrate results in undesirable heating. Another approach to plasma processing generates plasma in a remote location and couples the plasma to a processing chamber. Various types of remote plasma generators have been developed, including magnetron sources coupled to a cavity, inductively coupled toroidal sources, microwave irradiation directed at a plasma precursor, electron-cyclotron resonance generators, and others. For particular types of processes, such as cleaning processes, remote plasma techniques offer certain advantages.

Inductively coupled RF plasma systems are often used in processing semiconductor wafers, in part because they can generate large-area plasmas. In principle, inductively coupled plasma systems permit generation of a high-density plasma in one portion of a processing chamber (e.g. above the material being processed) and simultaneous shielding of the material from the plasma-generation region. Such systems attempt to use the plasma itself as a protective buffer that protects the material from various possible deleterious plasma effects attributable to characteristics of the plasma-generation region. Because the drive currents are only weakly coupled to the plasma, however, these plasmas cannot be made absolutely inductive and require high voltages on drive coils to compensate for the resulting inefficiency. These high voltages produce large electrostatic fields that cause high-energy ion bombardment, primarily on the reactor surfaces, but also on the material being processed.

Approaches to shield the electrostatic fields have included positioning Faraday shields within the process chamber, but the weak plasma-drive-current coupling results in the formation of large eddy currents in the shields, which in turn produces substantial power dissipation. An alternative approach, such as described in WO 99/00823, entitled "TOROIDAL LOW-FIELD REACTIVE GAS SOURCE," incorporated herein by reference, attempts to exploit a specific transformer arrangement in a toroidal RF plasma source. Semiconductor switching devices are used to drive the primary winding of a power transformer that couples electromagnetic energy to the plasma, thereby forming a secondary circuit of the transformer.

Toroidal plasma-source devices such as that described in WO 99/00823 have a number of limitations that it is desirable to overcome. For example, they are typically designed for only a specific load, thereby having limited operational flexibility. They are, moreover, restricted to operation at low RF frequencies (typically about 400 kHz), and require the use of a magnetic core, which contributes to efficiency losses. They also require an auxiliary starter to initiate plasma formation and require a flow of inert gas, such as Ar, to maintain the plasma. Such limitations are overcome with the present invention.

SUMMARY OF THE INVENTION

Embodiments of the invention are directed to an electrostatically shielded toroidal plasma source that does not use a magnetic core. Instead, the operation of the plasma source is achieved by direct inductive coupling between a current in a driving coil with the plasma current in the plasma chamber. The toroidal plasma source according to embodiments of the invention can be operated at high RF frequencies, i.e. greater than 400 kHz, with only water cooling. Plasma formation is achieved without the need for an auxiliary starter and without the need for including a flow of inert gas. The toroidal plasma source can accordingly be configured with a substrate processing system to achieve improved overall efficiency.

In a first embodiment, a metallic plasma source chamber defines an interior for plasma generation. The plasma source chamber includes at least one dielectric break. A drive inductor is configured such that the metallic plasma source chamber is positioned between loops of the drive inductor. An input coil is configured proximate the drive inductor to provide a mutual inductance between the input coil and the drive inductor. In one embodiment, the plasma source chamber is configured from two L-shaped portions assembled to form a rectangularly shaped enclosure. The dielectric break is defined by a gap between the two L-shaped portions. In one embodiment, the metallic plasma source chamber is grounded.

In another embodiment, the interior of the plasma source chamber is lined with a material that can be heated by the plasma, such as quartz. The liner acts to reduce losses due to oxygen recombination on surfaces, thereby improving the efficiency of substrate-processing operations.

These and other embodiments of the present invention, as well as its advantages and features are described in more detail in conjunction with the text below and the attached figures.

BRIEF DESCRIPTION OF THE DRAWINGS

FIG. 4 generally is a schematic illustration of different arrangements that may be used with the input loop and drive inductor to adjust their mutual inductance:

DESCRIPTION OF THE SPECIFIC EMBODIMENTS

I. Introduction

Embodiments of the present invention are directed to a downstream toroidal plasma source and a distributed plasma source that may be used as part of a semiconductor processing system. The plasma source may be configured to provide an ionized plasma and to provide a source of radicals; accordingly, the phrase "plasma source" is used herein to refer inclusively to a source for an ionized plasma and/or radicals. As described in detail below, embodiments of the invention include an electrostatically shielded plasma source that may run with 100% oxygen undiluted by an inert gas and with a nonmagnetic core. Tests on a device fabricated in accordance with the invention and with these properties show that it achieves substantially greater efficiency than prior devices that require use of a magnetic core.

II. Exemplary Substrate Processing System

Figure 1:
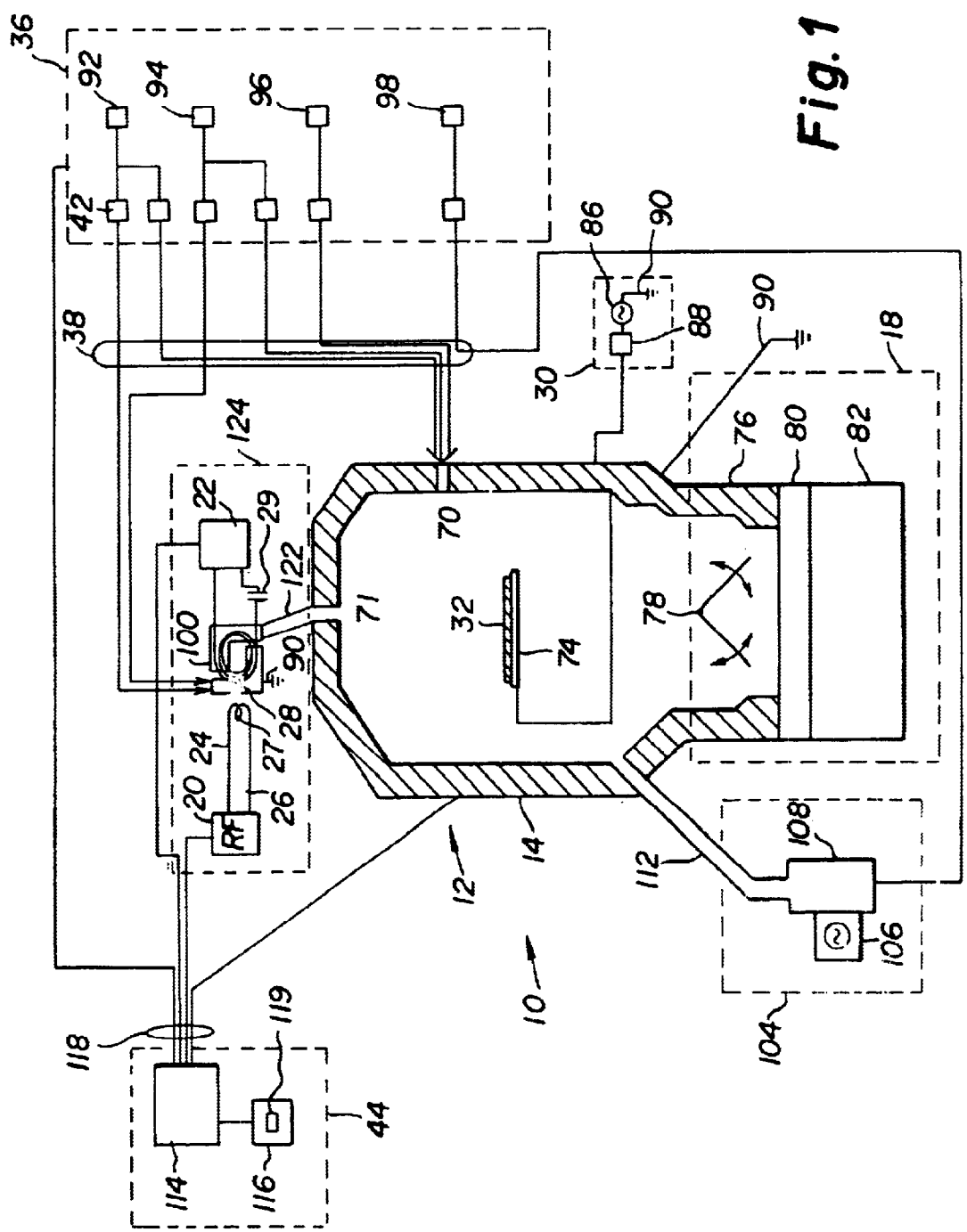
FIG. 1 is a simplified schematic diagram of a plasma-based chemical-vapor-deposition system according to an embodiment of the present invention.

The toroidal plasma source of the present invention may be used with a substrate processing system such as that shown schematically in FIG. 1. The substrate processing system 10 may be used for a variety of plasma processes, including plasma-based deposition processes and plasma-etching processes. The substrate processing system 10 includes a process chamber 12 having a chamber body 14, a vacuum system 18, a bias plasma system 30, a gas-delivery system 36, a system controller 44, an optional remote-plasma cleaning system 104, and a downstream plasma source system 124.

The process chamber 12 includes a substrate support member 74 positioned within the process chamber 12 to hold the substrate 32 during processing. The substrate support member 74 is configured to support wafers, which may, for example, have a diameter of approximately 200 mm or 300 mm for an appropriately sized process chamber 12. A bias plasma system 30 is optionally included for creating a potential difference at the substrate support member 74 to produce electrodynamic movement of the plasma normal to the substrate 32.

The gas delivery system 36 provides gases to the process chamber 12 and other system components through gas delivery lines 38, only some of which may be shown explicitly in FIG. 1. Typical gases provided by the gas delivery system 36 might include plasma precursor gases, such as a cleaning or etching plasma precursor gas, a plasma deposition precursor gas, plasma striking gas, plasma dilution gas, and other gases, such as a cleaning precursor gas provided to an optional remote plasma cleaning system 104, for example. The delivery lines 38 generally include some sort of control, such as a mass-flow controller 42 and shut-off valves (not shown). The timing and rate of flow of the various gases is controlled through a system controller 44, described in greater detail below.

Substrates are transferred into and out of the process chamber 12 by a robot blade (not shown) through an insertion/removal opening (not shown) in the side of the chamber body 14. Motor-controlled lift pins (not shown) are raised and then lowered to transfer the substrate 32 from the robot blade to the substrate support member 74. The substrate support member 74 may include a wafer-hold-down apparatus, such as an electrostatic chuck (not shown), that can selectively secure the substrate 32 to the substrate support member 74 during substrate processing if desired. In certain embodiments, the substrate support member 74 is made from anodized aluminum, aluminum, or aluminum oxide.

The temperature of the wafer may be controlled in different embodiments. For example, the substrate support member 74 may include a heater (not shown) to heat the wafer during processing, or to heat portions of the process chamber 12 during a cleaning process. Alternatively, a heat-transfer gas, such as helium (He), may be flowed through inner and/or outer passages in the wafer chuck. The gas flow has the additional effect of thermally coupling the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

The vacuum system 18 includes throttle body 76, which houses twin-blade throttle valve 78 and is attached to gate valve 80 and turbo-molecular pump 82. It should be noted that throttle body 76 offers minimum obstruction to gas flow, and allows symmetric pumping, as described in commonly assigned U.S. patent application Ser. No. 08/712,724 entitled "SYMMETRIC CHAMBER," by Ishikawa, filed Sep. 11, 1996, and which is herein incorporated by reference for all purposes. The gate valve 80 can isolate the turbo-molecular pump 82 from the throttle body 76, and can also control chamber pressure by restricting the exhaust flow capacity when the throttle valve 78 is fully open. The arrangement of the throttle valve 78, gate valve 80, and turbo-molecular pump 82 allows accurate and stable control of chamber pressures between about 1 millitorr and 3 torr. It is understood that other types of vacuum pumps and configurations of vacuum systems could be used with alternative embodiments of the present invention.

The bias plasma system 30 includes a bias generator 86 and an optional bias matching network 88. The bias plasma system capacitively couples the substrate support member 74 (and therefore also the substrate) to conductive (grounded) inner surfaces of the chamber through a common ground 90. The bias plasma system 30 serves to enhance the transport of plasma species, including reactive ions and other particles, created at the plasma source chamber to a surface of the substrate 32. The plasma source chamber 100 is also grounded through common ground 90.

The gas delivery system 36 provides gases from several gas sources 92, 94, 96, and 98 to the chamber and other system components via the gas delivery lines 38, only some of which might be shown. Gases can be introduced to various components of the substrate processing system in a variety of fashions. For example, gases can be introduced into the process chamber 12 through a side port 70, as shown, or through a top port 71. A gas mixing chamber (not shown) can be present between the gas sources and the chamber, or the top and/or side ports can be arranged with a number of parallel or concentric gas conduits to keep various gases separate until reaching the chamber. In an alternative embodiment, a gas delivery ring with a series of gas nozzles is provided about an inner circumference of the processing chamber.

The optional remote plasma cleaning system 104 is provided for periodic cleaning of deposition residues from chamber components. The cleaning system includes a remote microwave generator 106 that creates a plasma from a cleaning gas source 98 such as molecular fluorine, nitrogen trifluoride, other fluorocarbons or equivalents, in a reactor cavity 108. The reactive species resulting from this plasma are conveyed to the interior of process chamber 12 through a cleaning-gas feed port via an applicator tube 112.

The downstream plasma source system 124 includes an RF generator (power supply) 20 coupled to a single-turn input loop 27 by leads 24 and 26. The RF power is mutually coupled from the single-turn input loop 27 to a two-turn drive inductor 28 driven by drive 22 and resonated with a capacitor 29. The plasma source chamber 100 is positioned between the turns of the two-turn drive inductor and operates to provide a plasma to the process chamber 12 through applicator tube 122. The drive inductor 28 may generally be of any shape provided sufficient mutual flux linkage exists between the current-carrying drive inductor 28 and the interior of the plasma source chamber 100. In different embodiments, additional coil turns may be included in the drive inductor 28 on either side of the plasma source chamber 100. This design uses direct coupling between the drive inductor 28 and the plasma current in the plasma source chamber 100 so that a magnetic core is unneeded. Sometimes the design may conveniently be referred to as having an "air core" to distinguish it from magnetic-core designs, although strictly the design is more properly characterized as relying on direct coupling without a core.

The RF generator 44 operates at a nominal frequency of 13.56 MHz, but could operate at different frequencies, such as 60 Hz, 400 kHz, 2 MHz, 60 MHz, or 200 MHz among others, with appropriate design of the elements of the plasma system. The RF generator can supply up to 8 kW of power, but the processing system typically draws about 3–5 kW when processing a 200 mm wafer. It is understood that higher or lower power levels might be appropriate according to the type of process being performed and the size of the substrate.

The specific embodiment shown in FIG. 1 is not intended to limit the invention. For example, while the embodiment shown in FIG. 1 illustrates a configuration of the downstream plasma source system 124 that uses a single-turn input loop 27 mutually coupled with a two-turn drive inductor 28, other configurations may use different numbers of turns for these components. This electrical structure for the downstream plasma source system 124 is described more fully in FIG. 3 and related text below. While FIG. 1 illustrates schematically an embodiment where the plasma source chamber 100 is configured as a remote plasma source to provide a plasma at the top of the process chamber 12 through an applicator tube 122, the invention is not so limited, and it may alternatively be configured to provide the plasma at other locations of the process chamber 12.

The system controller 44 controls the operation of the substrate processing system 10. In one embodiment, the system controller includes a processor 114 coupled to a memory 116, such as a hard disk drive, a floppy disk drive, and a card rack (not shown). The card rack may contain a single-board computer (not shown), analog and digital input/output boards (not shown), interface boards (not shown), and stepper motor controller boards (not shown). The system controller 44 is coupled to other parts of the processing system by control lines 118 (only some of which might be shown), which may include system control signals from the system controller 44 and feedback signals from the substrate processing system 10. The system controller 44 conforms to the Versa Modular European (VME) standard, which defines board, card cage, and connector dimensions and types. The VME standard also defines the bus structure having a 16-bit data bus and 24-bit address bus. System controller 44 operates under the control of a computer program 119 stored on the hard disk drive or other computer programs, such as programs stored on a floppy disk. The computer program dictates, for example, the timing, mixture of gases, RF power levels, and other parameters of a particular process. The interface between a user and the system controller 44 is via a monitor (not shown), such as a cathode ray tube, and a light pen (not shown).

The toroidal plasma source according to various embodiments of the present invention may be used in numerous substrate-processing applications, in addition to plasma-based deposition procedures. For example, if the precursor gases include fluorine sources, such as $NF_3$ or $SF_6$, it may be used to provide a plasma for downstream cleaning. The plasma source may alternatively be used to provide an etching source, including for polymer etching and photoresist stripping. It is also specifically understood that other types of chambers might be adapted to a toroidal plasma source according to the present invention, and that different types of wafer support systems, such as a center pedestal, might be used, as well as different exhaust configurations, such as a perimeter exhaust configuration.

III. Downstream Toroidal Plasma Source

The general configuration of the plasma source chamber 100 according to one embodiment of the invention is illustrated in FIG. 2. Generally, the plasma source chamber 100 comprises a metallic enclosure that defines an internal closed-loop path for circulation of plasma species. The chamber includes at least one dc break gap which may be configured as described below to optimize operational conditions for the plasma source by balancing arc-discharge and gas-breakdown characteristics. In certain embodiments, fabrication of the plasma source chamber 100 is facilitated by assembling it from two or more individual components. In such cases, the number of dc break gaps will be equal to the number of component elements. One or more of the resulting dc break gaps may be conductively shunted with a metallic strip, permitting definition of the operational conditions in terms of a single nonshunted gap.

Figure 2A:
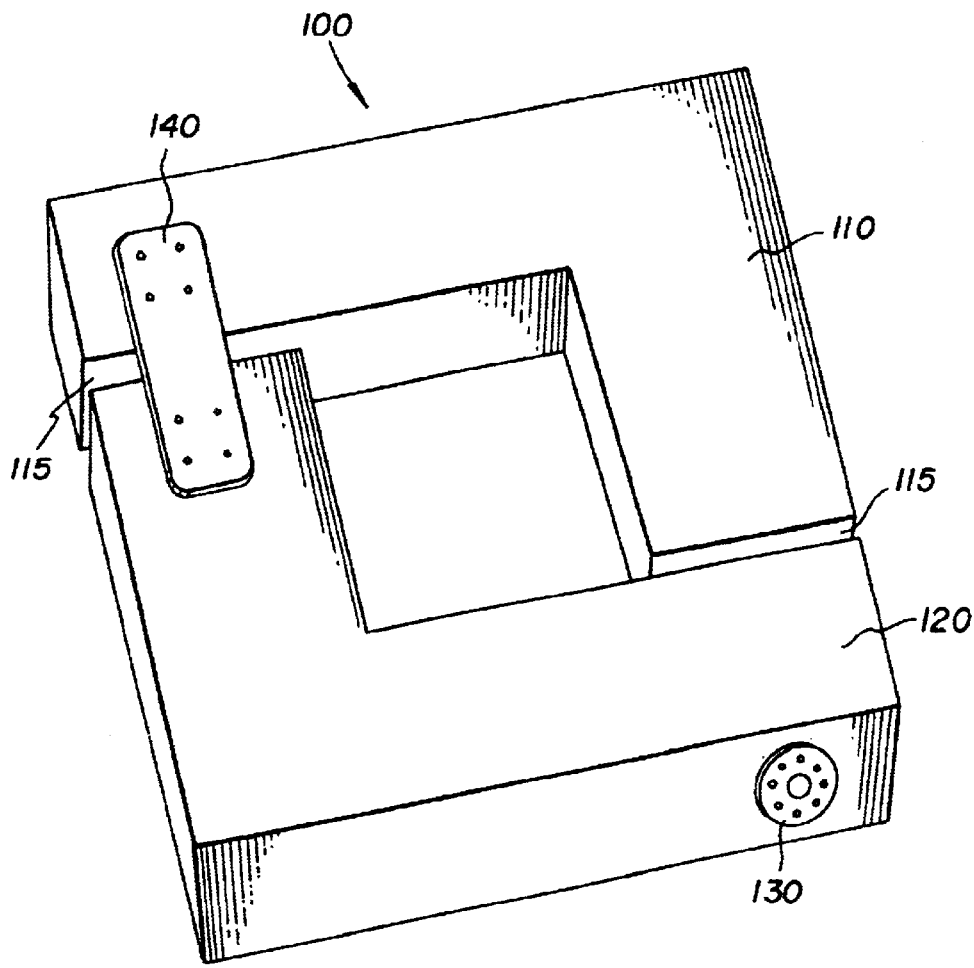
FIG. 2(a) is a perspective illustration of one embodiment of the plasma source chamber according to the present invention.

The specific plasma source chamber 100 shown in FIG. 2(a) provides an example of an embodiment where a plurality of individual components are used. In this example, two L-shaped metallic pieces 110 and 120 are assembled to form an substantially rectangularly shaped chamber with an approximately 1-inch diameter bore forming the closed path. In one embodiment, both L-shaped pieces 110 and 120 are formed from aluminum, either anodized or unanodized, permitting the plasma source chamber 100 to be water-cooled. Alternative cooling fluids, such as air, nitrogen, gas or helium gas may also be used, but as described below, the plasma source chamber 100 does not require active cooling. The cooling fluid can be provided through a conduit configuration in thermal communication with the plasma source chamber 100. Cooling fins to increase the total area of thermal communication with plasma source chamber 100 could also be added. In alternative embodiments, other metals that do not require active cooling, such as copper, are used to form the plasma source chamber. Gases are input into the chamber, and plasma in output from the chamber through flow ports 130, one of which is shown in FIG. 2(a). In different embodiments described below, the plasma source chamber 100 may be equipped with a plurality of flow ports 130 depending on how the plasma source chamber 100 is configured with respect to the process chamber 12.

Figure 2B:
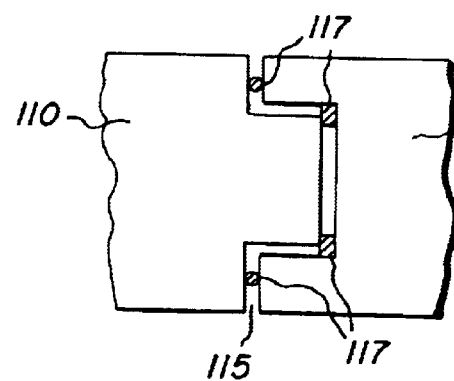
FIG. 2(b) shows a cross-sectional view of the plasma source chamber, showing the positioning of centering rings used as dielectric breaks in one embodiment.

The rectangular configuration of the plasma source chamber 100 in the exemplary embodiment defines two gaps 115 when the two L-shaped pieces 110 and 120 are configured to form a rectangle. Dielectric breaks 117, such as shown in FIG. 2(b), in the gaps 115 prevent electrical shorting of the individual source chamber components between each other and do not impede the penetration of RF induction fields into the vacuum region within the plasma source chamber 100. The dielectric breaks 117 may be formed, for example, with teflon centering rings (such as, e.g., KF-25 teflon centering rings), as shown in the cross-sectional view of a junction between the two component pieces in FIG. 2(b). The dielectric breaks 117 are positioned within a gap 115, which may itself be defined more particularly by shaping the L-shaped pieces 110 and 120 for interconnection at the junction, for example as shown in FIG. 2(b).

With the configuration of two L-shaped pieces 110 and 120 shown in FIG. 2(a), the plasma source chamber 100 may have two gaps 115 at the junctions of the individual components or may intentionally be electrically shorted at one of the gaps, for example by including metallic (aluminum) shunt 140, so that operationally the plasma source chamber 100 functions as with a single gap 115. While the rectangular embodiment comprising two L-shaped components is convenient to fabricate, there are alternative configurations that are also within the scope of the invention. For example, the junctures of the legs could be arcuate. Alternatively, the shape of the plasma source chamber 100 may define a nonrectangular polygon or a continuous closed curve such as a circle or ellipse.

In operation, the plasma source chamber 100 is placed between the turns of the two-turn drive inductor, which is also preferably capacitively resonated. The drive inductor may be comprised of wide sheet metal for low loss and tight magnetic coupling to the plasma source chamber 100. The RF power is mutually coupled from a single turn input loop 27 to the two-turn drive inductor. A resulting advantage of the invention is that with such a configuration no magnetic core is needed.

Figure 2C:
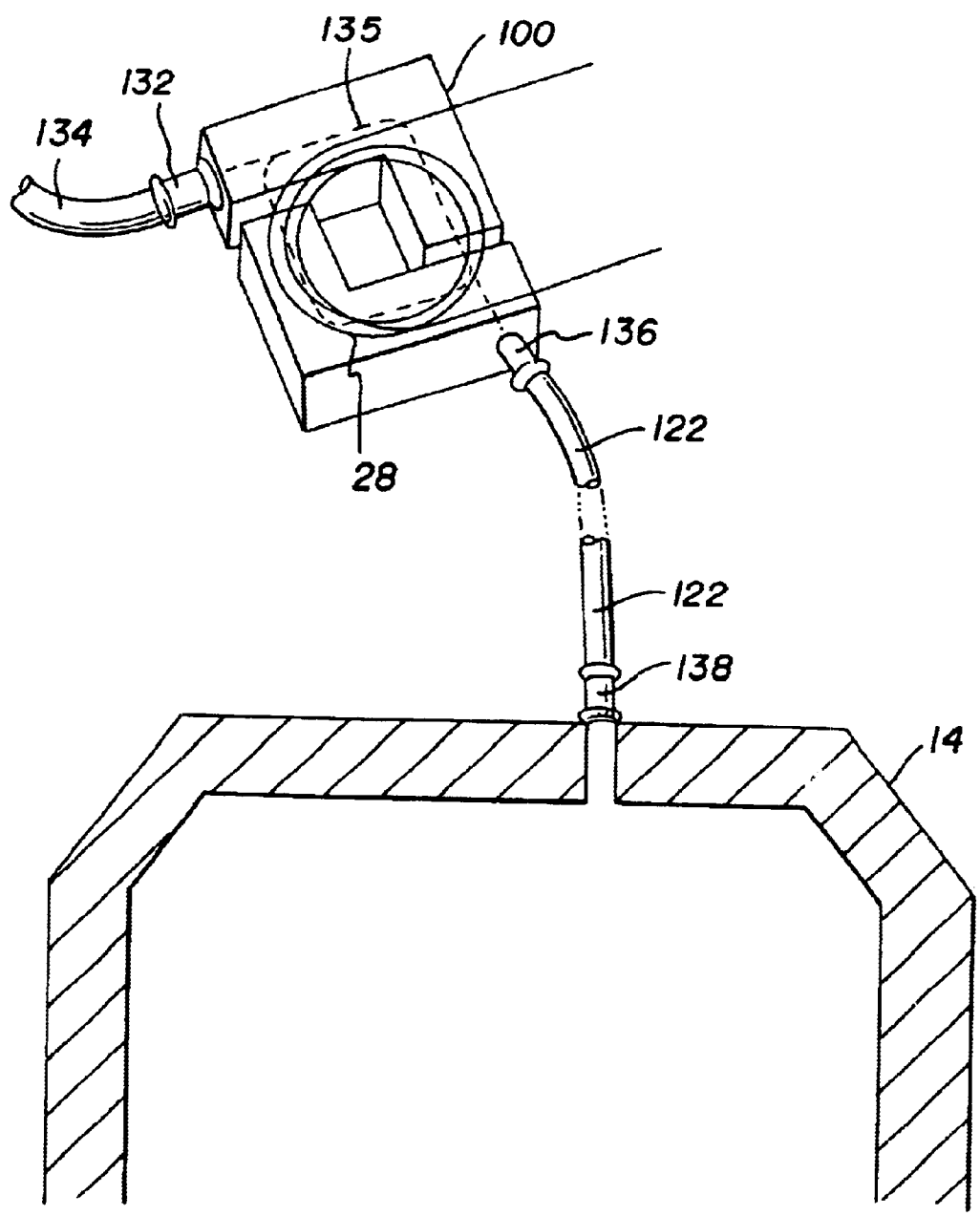
FIG. 2(c) shows a perspective illustration of the plasma source chamber configured to act as a downstream plasma source.

One embodiment in which the plasma source chamber 100 is configured as a downstream plasma source is shown in detail in FIG. 2(c). In this embodiment, using the rectangular configuration, gas enters at one corner of the rectangular plasma source chamber 100 and plasma and/or active neutrals leave from the diagonally opposite corner. As shown, gas is provided to the plasma source chamber 100 though a gas delivery line 134, which is connected to the flow port with a gas-tight connector 132. For appropriate RF energy, the penetration of the RF induction fields into the plasma source chamber 100 provides sufficient energy to ionize the gas to form and maintain the plasma. No auxiliary starting mechanism is required for plasma initiation and there is no operational distinction between initiation and load conditions.

This plasma initiation behavior has been confirmed with specific observations through observation windows, which may optionally be included on sides of one or both of the L-shaped pieces 110 or 120. During such observations, a brief transition of capacitive discharge may be observed when both precursor gas and RF induction fields are initially present in the plasma source chamber 100, but there is sufficient capacitance field at the gap(s) 115 that the plasma initiates spontaneously when operational conditions are satisfied. As a result, there is no significant transition between the initiation state and the steady state.

As the gas is ionized to form the plasma along path 135, plasma species and/or active neutrals leave the plasma source chamber 100 through applicator tube 122. The applicator tube 122 connects the plasma source chamber 100 to the process chamber 12 with gas-tight connectors 136 and 138. Such a configuration is suitable, for example, for applications such as downstream etching.

Figure 3:
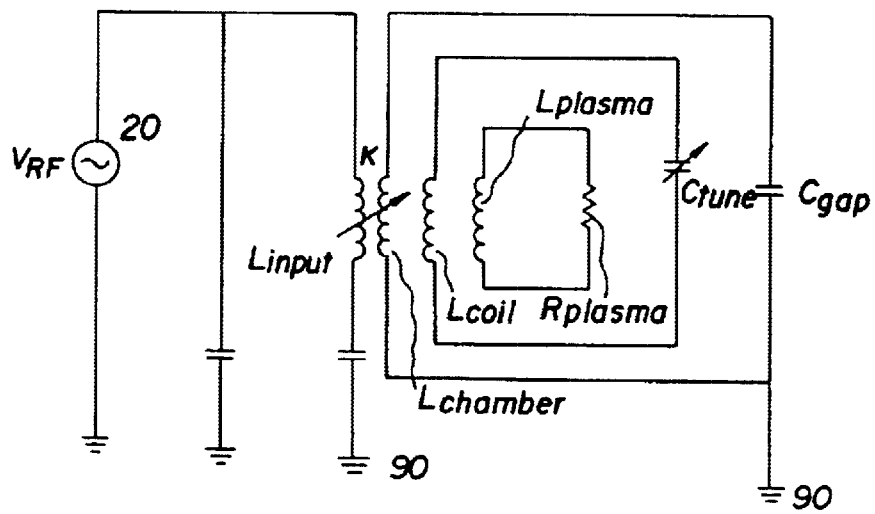
FIG. 3 is an equivalent circuit diagram showing the electrical characteristics of a toroidal plasma source according to an embodiment of the invention in operation.

The operational characteristics of the plasma source according to the invention may be further understood with reference to FIG. 3, which shows a circuit diagram equivalent to the electrical behavior governing operation of the plasma source. The RF generator 20 is in electrical communication with the single-turn input loop 27 having a variable input inductance $L_{input}$. The plasma source chamber 100 itself has a chamber inductance $L_{chamber}$ and capacitance $C_{gap}$, which is determined by the size of gap(s) 115 between the L-shaped components. The inductance of the two-turn drive inductor between whose turns the plasma source chamber 100 is placed is denoted by $L_{coil}$ with the variable resonating capacitance denoted by $C_{tune}$. The circulation of the ionized plasma particles within the plasma source chamber 100 produces a further inductance $L_{plasma}$, the plasma also having a resistive component $R_{plasma}$. The coupling of these inductive components forms a transformer circuit that operates as part of the toroidal plasma source when the process chamber is in operation. As indicated, the plasma source chamber 100 is grounded through common ground 90, such that no additional dc gap is required.

Figure 4A:
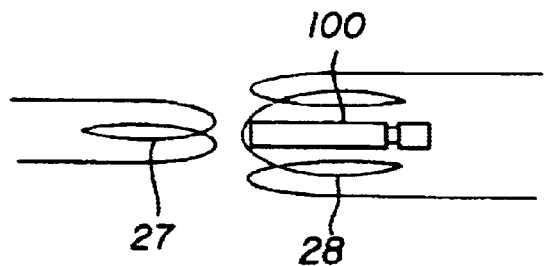
FIG. 4(a) shows an embodiment where the axes of the input loop and drive inductor are parallel.
Figure 4B:
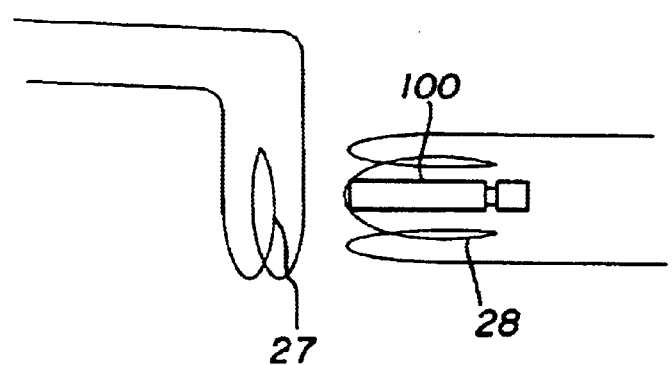
FIG. 4(b) shows an embodiment where the axes of the input loop and drive inductor are perpendicular.
Figure 4C:
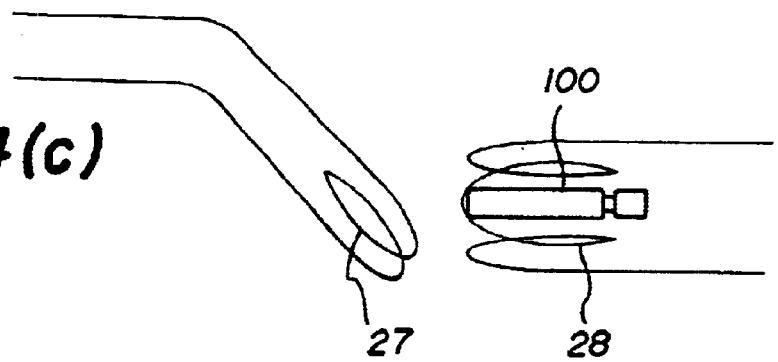
FIG. 4(c) shows an embodiment where the axes of the input loop and drive inductor are at an intermediate angle.
Figure 4D:
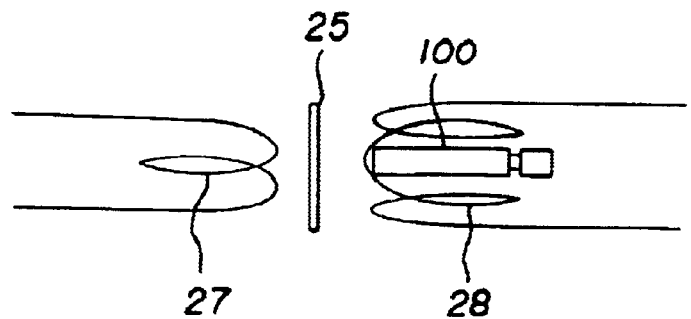
FIG. 4(d) shows an embodiment where a metal strip is positioned between the input loop and drive inductor.

For this example circuit, the plasma source is matched to the RF generator by varying two things: (1) the coefficient of coupling K (and therefore the mutual inductance) and (2) resonating with the tune capacitance $C_{tune}$. The coupling K may be varied by changing the proximity between the input loop 27 and drive inductor 28, or alternatively by changing the rotational orientation between the input loop 27 and drive inductor. For example, as shown in FIG. 4(a), the axes of the input loop 27 and drive inductor 28 may be oriented parallel to one another; they may be oriented perpendicularly to one another as shown in FIG. 4(b); or they may be oriented at intermediate positions as shown in FIG. 4(c). Alternatively, the coupling K may be varied by inserting one or more metallic blades 25 between the input loop 27 and drive inductor 28 as shown in FIG. 4(d). While the input loop self-inductance $L_{input}$ may be incidentally affected by such variations, the change in K is much more significant.

The use of direct coupling between the drive inductor and the plasma current according to the invention may be adapted to other substrate processing systems. For example, a toroidal plasma source having an "air core" may be incorporated within the process chamber 12. An illustration of a toroidal plasma source incorporated within the process chamber 12 is described in the copending, commonly assigned U.S. Patent Application, filed May 25, 200 and assigned Ser. No. 09/584,167, entitled "TOROIDAL PLASMA SOURCE FOR PLASMA PROCESSING," by Michael S. Cox et al., which in incorporated herein by reference for all purposes.

IV. Operating Parameters

Figure 5:
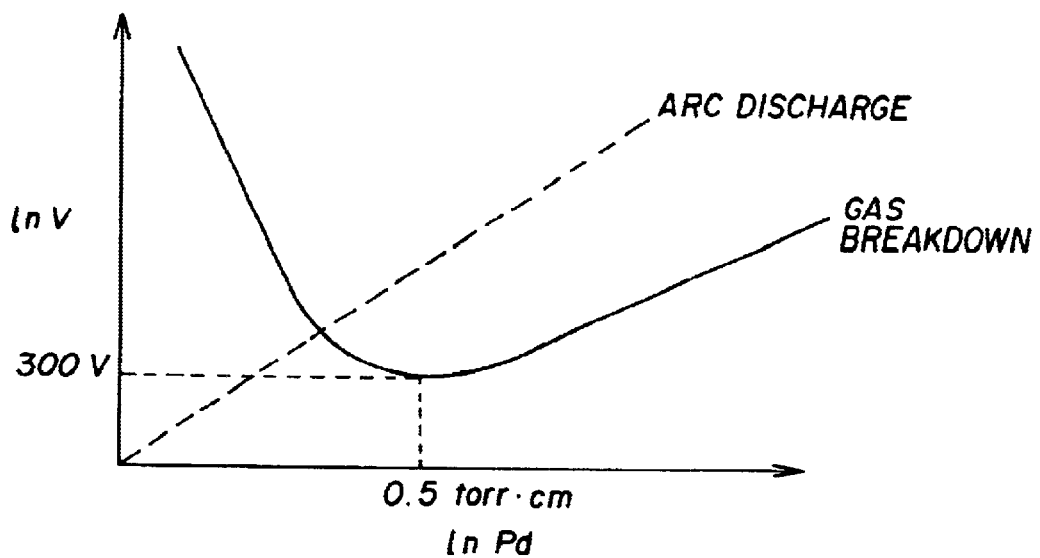
FIG. 5 is a graphical representation of general arc-discharge and gas-breakdown behavior.

Considerations used to determine the operational characteristics of the toroidal plasma source, including the size of the gap(s) 115, are illustrated in FIG. 5, which plots the general arc-discharge and gas-breakdown behaviors. The curves are plotted in logarithm—logarithm form. The logarithm of the arc-discharge voltage increases monotonically with the logarithm of the product $Pd_{gap}$, where P is the pressure in the plasma source chamber 100 and $d_{gap}$ is the size of the gap 115. The gas-breakdown curve includes a characteristic minimum at $Pd_{gap} \approx 0.5$ torr cm and $V \approx 300$ V. In many cases, it is desirable to minimize capacitive coupling and maximize inductive coupling of RF power from generator to plasma for maximum reaction rate (etch rate or deposition rate, for example). Although the source is electrostatically shielded by grounding the plasma source chamber halves, the existence of an inductively coupled plasma in the plasma source chamber requires an induced voltage along the plasma within the source plasma chamber.

Typical induced electric field magnitudes are a few volts per cm (i.e. 2–4 V/cm). For a path length of about 60 cm, this gives rise to 120 to 240 volts induced loop voltage. This voltage appears across the dc break gap(s). Depending on this induced loop voltage, the gas pressure within the source chamber and the effective gap(s) distance, there may be a capacitively coupled plasma proximate to the gap(s). To minimize the capacitive coupling, the gap may be selected to avoid the region of the gas breakdown curve that is near the minimum (where the minimum voltage can break down the gas).

The gap may be selected to operate on the left-hand-side of the minimum (small $Pd_{gap}$ product relative to the minimum $Pd_{gap}$ for easiest gas breakdown) or on the right-hand-side of the minimum (large $Pd_{gap}$ product relative to the minimum $Pd_{gap}$ for easiest gas breakdown). For left-hand-side operation, and 2× margin (of $Pd_{gap}$) from the $Pd_{gap}$ minimum, the condition $Pd_{gap} \leq 0.25$ torr cm should be satisfied. Thus (for left-hand-side operation), for example, at 20 torr, the gap should be $\leq 0.125$ mm, and at 0.2 torr, the gap should be $\leq 12.5$ mm. For right-hand-side operation, and 2× margin (of $Pd_{gap}$) from the $Pd_{gap}$ minimum, the condition $Pd_{gap} \geq 1$ torr cm should be satisfied. Thus (for right-hand-side operation), for example, at 20 torr, the gap should be $\geq 0.5$ mm, and at 0.2 torr, the gap should be $\geq 50$ mm.

Taking the left-hand-side solution for a high pressure of 20 torr, the gap should be $\approx 0.125$ mm. Using the left-hand-side solution may leave the possibility of an undesirable arc discharge at the gap(s). This can be minimized by coating the metal surfaces in the gap area with a sufficiently high-dielectric-strength insulator such as by anodization or by using a high-dielectric-strength solid insulator between metal surfaces (such as $Al_2O_3$). Finally, the capacitive reactance per unit length across the gap should be large relative to the impedance per unit length of the plasma loop to avoid capacitively shorting out the plasma source chamber halves, which could shield out the RF inductive field.

For a plasma loop impedance of the order of 1Ω and a loop length of 60 cm, then the capacitive reactance per unit length across the gap should be large compared to 1Ω/60 cm. For a plasma source chamber cross-section of 4 cm×4 cm, with a 2.5 cm diameter bore, the area is A=11 cm². For a gap of 0.125 mm and unit dielectric constant k=1, then the capacitance C across the gap is approximately 79 pF, as determined from the relationship $C=A\epsilon_0 k/d_{gap}$, where $\epsilon_0$ is the permittivity of free space. At an RF frequency of 13.56 MHz, the impedance of the gap is thus approximately 149Ω, as determined from the relationship $Z=1/\omega C$, with $\omega$ equal to $2\pi$ times the RF frequency. The impedance per unit length of the gap is thus 149Ω/0.125 mm=$1.2 \times 10^4$ Ω/cm. This is significantly larger than the impedance per unit length of the plasma loop of 1Ω/60 cm=0.02Ω/cm. Thus, in the absence of a strong capacitive plasma at the gap (precluded by appropriate selection of $Pd_{gap}$ as described above to avoid the $Pd_{gap}$ minimum), the capacitive reactance across the gap(s) will not short out the plasma source chamber and prevent inductive coupling to it.

As described above, the effective transformer arrangement uses direct coupling between the driving inductor and the plasma current. As a result, losses attributable to the use of a magnetic core, such as ferrite, used in other toroidal plasma source designs are avoided. Thermal considerations that govern the invention permit operation without requiring a magnetic core, so that the known cooling complexities associated with the use of magnetic cores in toroidal plasma sources are thus also avoided. For example, in continuous-operation tests of a plasma source constructed according to the embodiment of the invention described above, at a power of 2.5 kW for more than 30 minutes, no thermal runaway was observed and the exterior temperature of the plasma source chamber 100 did not exceed 40° C. even without a magnetic core. During such tests, operation of the plasma source in an inductive mode was confirmed through direct observation of a continuous tube of plasma emission within the plasma source chamber 100. Such observations were specifically contrasted with capacitive discharge, which instead would have shown a maximum emission between the L-shaped chamber halves. Losses in the input loop and drive coil were low, as indicated by the lack of significant temperature rise even with only air cooling of the coils.

The plasma source chamber 100 according to the embodiment described above effectively accommodates mass flow rates of 0.5–20 liters/min of oxygen. This oxygen-delivery capability has a notable effect on the operational characteristics of the plasma source when used to strip photoresist. Molecular oxygen molecules provided to the plasma source chamber 100 ionize to form oxygen molecular ions $O_2^+$. The molecular ions dissociatively recombine with electrons to from two oxygen atoms, which are an effective photoresist etching agent. It is thus desirable to have a plasma source system that can accommodate greater oxygen flow rates.

Photoresist-stripping tests have been performed to compare these operational characteristics with those of the magnetic-core device described in WO 99/00823 ("the '823 device"). Photoresist silicon wafer pieces with an area of ~1 cm² were clamped to a temperature-controlled substrate support member 74 about 20 cm downstream of the plasma source. Using a pressure>0.5 torr, no plasma is present that far from the source outlet. Typically, downstream emission (a dim green color) is present below the plasma source in the region of the substrate support member 74. When polymer is etching a sufficient rate, a thin blue layer of emission is visible at the surface of the sample. Both plasma sources provided by the present invention and by the '823 device transfer significant heat to the neutral gas at high mass flow rates.

In the test trials, the '823 device could not be operated with 100% oxygen and required dilution with, e.g., Ar to sustain the plasma. The '823 device operated with a 360 kHz switch-mode generator with fixed transformer impedance ratio and fixed 300 V (dc) line voltage. The photoresist strip rate was optimized by flowing as much oxygen as possible (4 liters/min) while maintaining plasma, using high Ar flow dilution (10 liters/min) and maximum pumping speed (pressure of 3 torr in the process chamber 12). Under these conditions, the RF power delivered was 5 kW. With the substrate support member 74 maintained at 80° C., the photoresist etch rate was a repeatable 3500 Å/min.

The toroidal plasma source shown in FIG. 3, which may instead be operated with 100% oxygen, was run at an RF frequency of 13.56 MHz. The etch rate was optimized by using an oxygen flow rate of 9 liters/min at maximum pumping speed (pressure of 2 torr in the process chamber 12). With RF power also delivered at 5 kW and the substrate support member 74 also maintained at 80° C., the photoresist etch rate was a repeatable 7500 Å/min. As explained above, the higher etch rate realized by the plasma source according to the present invention is a consequence of the ability to maintain a plasma at significantly greater (undiluted) oxygen flow rates.

V. Interior Liner

It has been discovered by the inventors that still further increases in etch rates may be achieved by lining the interior of the plasma source chamber 100 with a material that is heated with energy from the plasma. For example, when the downstream plasma source is used to provide an etchant, including such a liner made of quartz is observed to produce an increase in photoresist strip rates of ~4 μm/min. Under the operating conditions described above, heat generated by the plasma within the plasma source chamber causes the quartz liner to reach a temperature of approximately 600–700° C.

It is hypothesized that the heat of the liner acts to reduce losses due to recombination of oxygen on the interior surfaces of the plasma source chamber 100. This mechanism may operate to produce a synergistic enhancement of photoresist etch rates as a result of temperature and material effects. Alternatively to quartz, the liner may be manufactured of ceramic, Si, SiC, $Al_2O_3$, or sapphire, among other materials, and still achieve an improvement in etch rates over an unlined plasma source chamber.

VI. Exemplary Distributed Plasma Source Chamber Configurations

The plasma source chamber 100 according to the present invention may also be used in configurations as a distributed plasma source. Various such exemplary configurations are illustrated in FIGS. 6(*a*)–6(*c*), although other configurations are also within the scope of the invention. For simplicity, the drive inductor(s) 28 is not shown. The plasma course chamber 100 lends itself to several different plasma-movement mechanisms that may be adopted, including diffusion and bias-initiated flow.

One embodiment is shown in FIG. 6(*a*), where the basic closed double-L-shaped structure is modified by removing a portion of the structure to produce an open plasma source chamber 100'. In the illustrated embodiment, the open plasma source chamber 100' includes a single gap 115'. Precursor gases are provided to the open plasma source chamber 100' with gas-delivery line 134, which is connected to the open plasma source chamber 100' with gas-tight connector 132. Plasma movement may be directed with an induction coil 158, which creates an electric field within the open plasma source chamber 100' to act on ionic species. The charged particles thus follow a closed path 162, which causes the plasma species to move proximate the substrate support member 74. Alternatively, the bias generator 86 may be activated to attract the ionized plasma species electrodynamically towards the substrate support member. In some such embodiments, the open plasma source chamber 100' may be formed integrally with the process chamber 12 and is therefore effectively positioned within the process chamber 12.

A variation is shown in FIG. 6(*b*) where flow ports 182, 184, 186, and 188 are positioned at corners on an underside of the double-L-shaped plasma source chamber 100". The upper portion of the figure is a perspective representation of the plasma movement within the process chamber 12, which is also shown in the lower portion of the figure as an orthographic projection of the underside. Precursor gases are provided to the open plasma source chamber 100" with gas-delivery line 134, which is connected to the open plasma source chamber 100" with gas-tight connector 132. Gas-tight connectors are also used to connect the flow ports 182, 184, 186, and 188 to the process chamber 12. A plurality of output flows are directed through individual segments of the rectangular structure with inductors 190, each of which generates a component of the total electric field within the plasma source chamber 100" and thereby to directs the charged plasma species.

In the specific embodiment shown, plasma loop 164 flows out flow port 182 and into flow port 184; plasma loop 166 flows out flow port 184 and into flow port 186; plasma loop 168 flows out flow port 188 and into flow port 186; and plasma loop 170 flows out flow port 188 and into flow port 182. By superposing these flows it is evident that the net flow at flow ports 182 and 186 vanishes, with a net flow into flow port 184 and out of flow port 188. In certain embodiments, this configuration may thus also be used to provide movement of plasma proximate a substrate support holder 74. In the same manner as illustrated in FIG. 6(*a*), a bias generator may be activated to attract the ionized plasma species electrodynamically towards the substrate support member. Since the plasma source chamber 100" is integrally connected with the process chamber in this embodiment, it may be considered as effectively positioned within the process chamber 12. It will also be understood that various other positions for flow ports and plasma flow combinations remain within the scope of the invention.

Figure 6A:
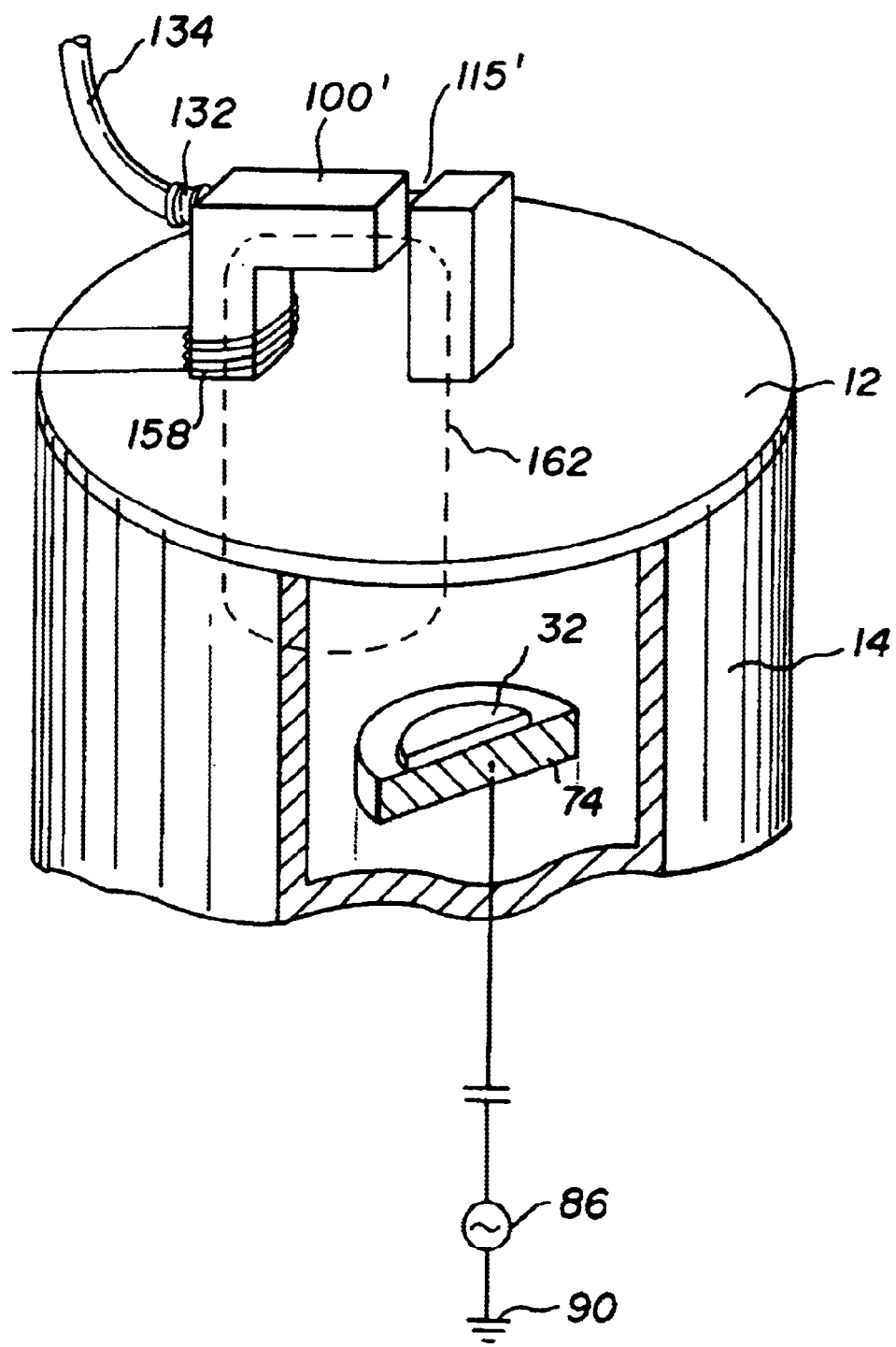
FIG. 6(a) shows one configuration of an open plasma source chamber in accordance with the invention.
Figure 6B:
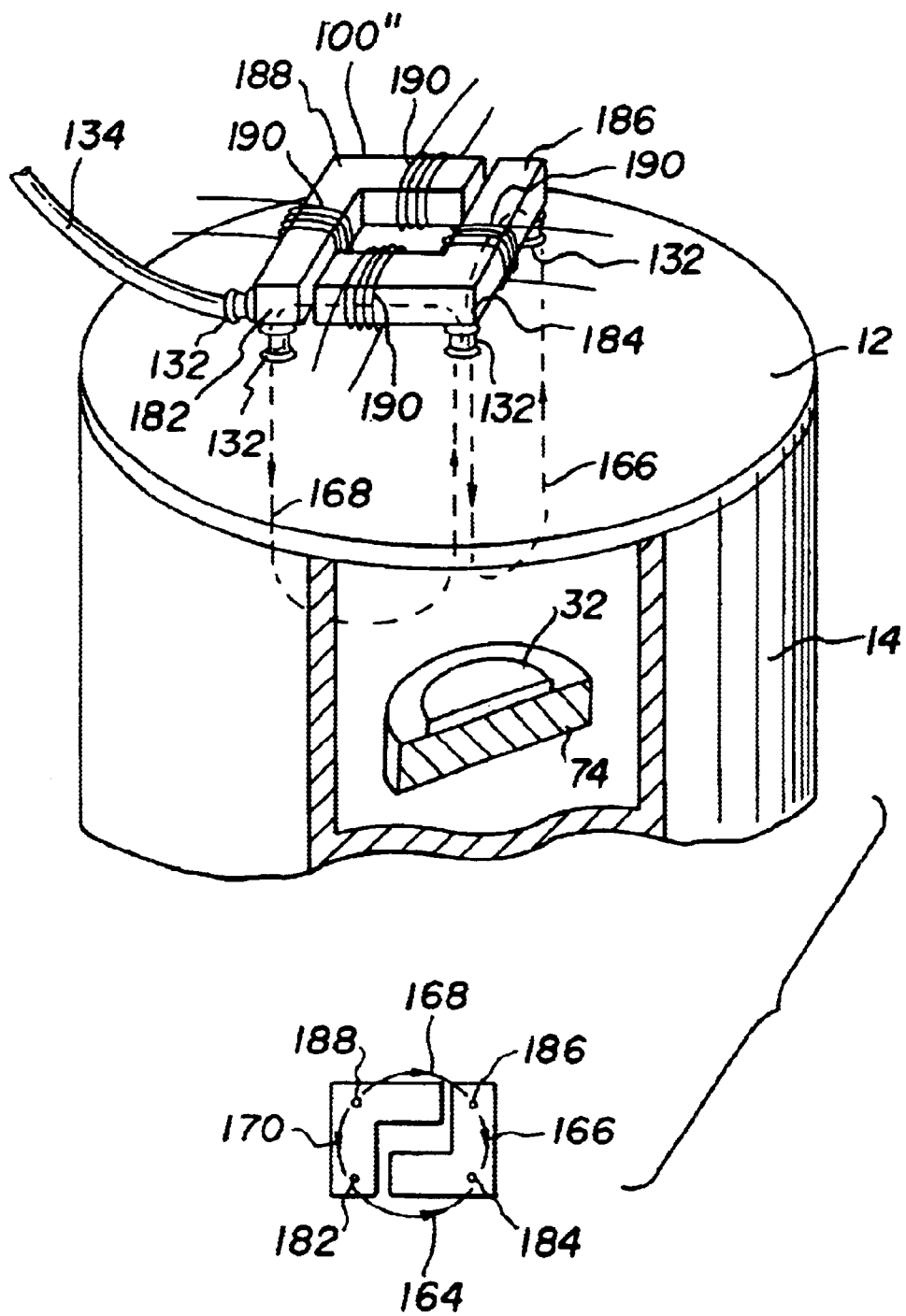
FIG. 6(b) shows one configuration of a multiple-flow-port plasma source chamber in accordance with the invention.
Figure 6C:
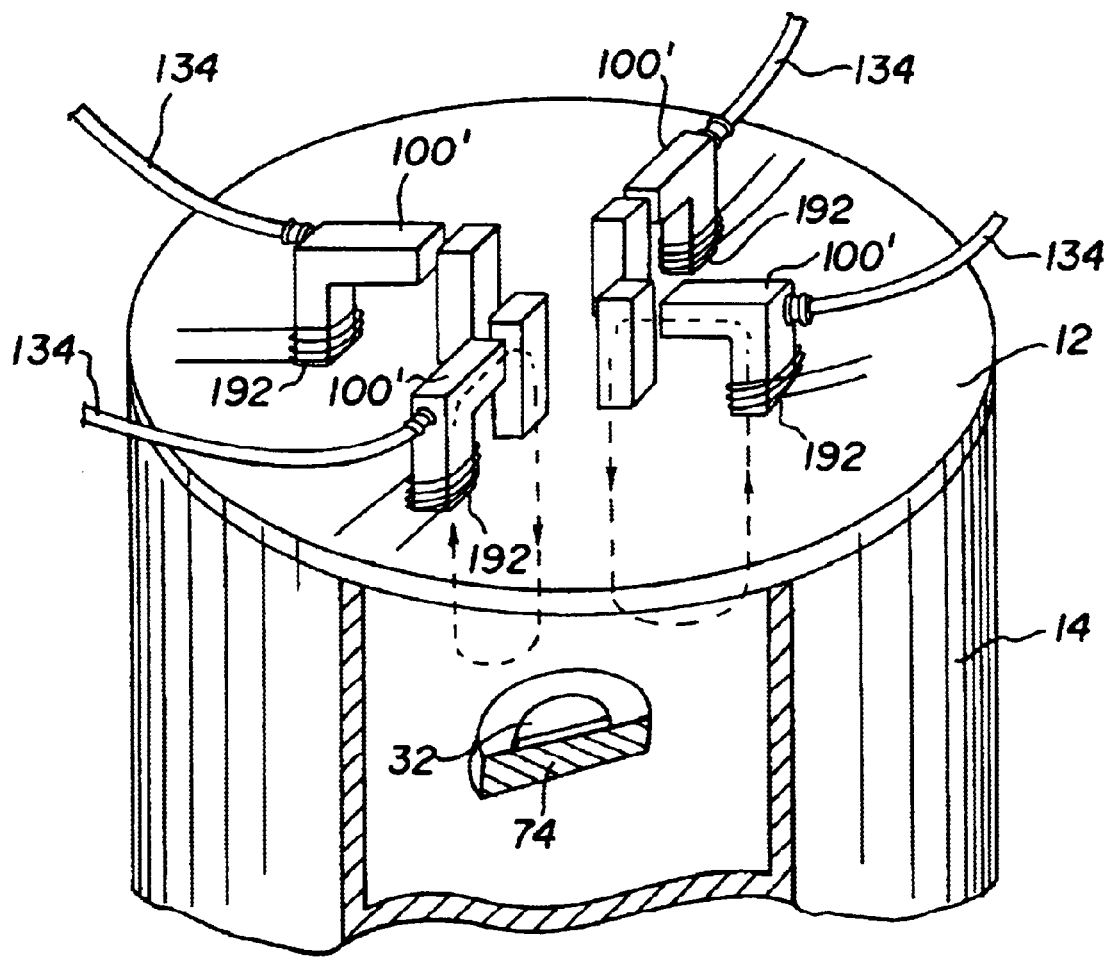
FIG. 6(c) shows an embodiment in which multiple plasma source chambers are constructively configured to increase overall flow.

Still a further configuration is shown in FIG. 6(c) using multiple open plasma source chambers 100', each in approximately the form illustrated for a single open plasma source chamber 100' in FIG. 6(a). Each of the open plasma source chambers 100' is connected to a gas-delivery line 134 through a gas-tight connector. Each also includes an inductor 192 to create an electric field within the open plasma source chambers 100' for directing movement of ionic species as desired. As shown in the figure, each individual chamber 100' contributes to an overall plasma flow in the center of the arrangement with input flows occurring at the circumference of the arrangement. Although not explicitly shown for convenience of illustration, a bias generator may be activated in the same manner as in FIG. 6(a) to attract the ionized plasma species electrodynamically towards the substrate support member.

The use of multiple open plasma source chambers 100' contributing flows constructively permits an increase in the overall plasma flow for applications in which such increased flow is beneficial or desirable. While the illustrated configuration shows four approximately regularly spaced open plasma source chambers 100', it will be understood that different numbers of the chambers and different arrangements, including irregular spacing arrangements, may be used to achieve particular plasma flow characteristics. In addition, the individual plasma source chambers 100 in the arrangement may, in one embodiment, be run at different RF frequencies to limit crosstalk among them.

Having described several embodiments, it will be recognized by those of skill in the art that various modifications, alternative constructions, and equivalents may be used without departing from the spirit of the invention. For example, embodiments having a greater number of dielectric breaks may be used. Accordingly, the above description should not be taken as limiting the scope of the invention, which is defined in the following claims.

What is claimed is:

1. A toroidal plasma source comprising:
   (a) a metallic plasma source chamber defining an interior for plasma generation, the plasma source chamber including at least one dielectric break;
   (b) a drive inductor configured such that the metallic plasma source chamber is positioned between loops of the drive inductor; and
   (c) an input coil configured proximate the drive inductor to provide a mutual inductance between the input coil and the drive inductor.

2. The toroidal plasma source according to claim 1 wherein the interior of the plasma source chamber defines a closed loop.

3. The toroidal plasma source according to claim 1 wherein the plasma source chamber comprises two dielectric breaks.

4. The toroidal plasma source according to claim 1 wherein the plasma source chamber comprises two L-shaped portions assembled to form a rectangularly shaped enclosure.

5. The toroidal plasma source according to claim 1 wherein the plasma source chamber is made of a material that comprises aluminum.

6. The toroidal plasma source according to claim 1 further comprising means for water-cooling the plasma source chamber.

7. The toroidal plasma source according to claim 1 wherein the plasma source chamber includes a liner formed on a surface in the interior of the plasma source chamber.

8. The toroidal plasma source according to claim 7 wherein the liner is formed of quartz.

9. The toroidal plasma source according to claim 1, further including an RF power source coupled with the drive inductor.

10. The toroidal plasma source according to claim 9 wherein the RF power source is configured to operate at a frequency greater than 400 kHz.

11. The toroidal plasma source according to claim 10 wherein the RF power source is configured to operate at a frequency of approximately 13.56 MHz.

12. The toroidal plasma source according to claim 1 wherein the drive inductor comprises two turns.

13. The toroidal plasma source according to claim 1 wherein the input coil comprises a single input loop.

14. The toroidal plasma source according to claim 1 wherein the metallic plasma source chamber is grounded.

15. A toroidal plasma source comprising:
   (a) a grounded metallic plasma source chamber defining an interior for plasma generation, the plasma source chamber including two L-shaped aluminum portions assembled to form a rectangularly shaped enclosure;
   (b) a quartz liner configured to line the interior of the plasma source chamber;
   (c) a drive inductor configured such that the metallic plasma source chamber is positioned between loops of the drive inductor;
   (d) an input coil configured proximate the drive inductor to provide a mutual inductance between the input coil and the drive inductor; and
   (e) an RF power source capacitively coupled with the drive inductor.

16. A substrate processing system comprising:
   (a) a process chamber;
   (b) a substrate support within the process chamber and disposed to hold a substrate; and
   (c) a toroidal plasma source configured to provide plasma to the process chamber, the toroidal plasma source including:
      (i) a metallic plasma source chamber commonly grounded with the process chamber, the plasma source chamber defining an interior for plasma generation and including at least one dielectric break;
      (ii) a drive inductor configured such that the metallic plasma source chamber is positioned between loops of the drive inductor; and
      (iii) an input coil configured proximate the drive inductor to provide a mutual inductance between the input coil and the drive inductor.

17. The substrate processing system according to claim 16 wherein the interior of the plasma source chamber defines an open path.

18. The substrate processing system according to claim 16, wherein the interior of the plasma source chamber defines an open path and the toroidal plasma source further includes:
   (iv) a plurality of plasma output ports configured approximately perpendicular to the closed path; and
   (iv) a plurality of induction coils configured to direct plasma movement from the plasma output ports.

19. The substrate processing system according to claim 16, the substrate processing system comprising a plurality of such toroidal plasma sources, wherein such toroidal plasma sources are configured to provide plasma movement to the process chamber constructively with one another.

* * * * *